United States Patent
Klee et al.

(10) Patent No.: US 7,989,917 B2
(45) Date of Patent: Aug. 2, 2011

(54) INTEGRATED CIRCUIT DEVICE INCLUDING A RESISTOR HAVING A NARROW-TOLERANCE RESISTANCE VALUE COUPLED TO AN ACTIVE COMPONENT

(75) Inventors: Mareike Klee, Hueckelhoven (DE); Rainer Kiewitt, Roetgen (DE); Mik Ju, San Jose, CA (US); Jeffrey Zhang, San Jose, CA (US); Christopher Taylor, Langham (GB)

(73) Assignee: NXP B.V., Eindhoven (NL)

( * ) Notice: Subject to any disclaimer, the term of this patent is extended or adjusted under 35 U.S.C. 154(b) by 573 days.

(21) Appl. No.: 10/302,349

(22) Filed: Nov. 22, 2002

(65) Prior Publication Data

US 2003/0146463 A1 Aug. 7, 2003

(51) Int. Cl.
*H01L 27/06* (2006.01)
(52) U.S. Cl. .......... 257/533; 257/E27.024; 257/E27.071
(58) Field of Classification Search .................. 257/528, 257/532–543
See application file for complete search history.

(56) References Cited

U.S. PATENT DOCUMENTS

| | | | | |
|---|---|---|---|---|
| 3,988,824 A | * | 11/1976 | Bodway | 216/16 |
| 4,612,562 A | * | 9/1986 | Motojima et al. | 257/110 |
| 6,458,255 B2 | * | 10/2002 | Chiang et al. | 204/192.15 |
| 6,642,131 B2 | * | 11/2003 | Harada | 438/591 |
| 6,984,577 B1 | * | 1/2006 | Zhao et al. | 438/619 |

FOREIGN PATENT DOCUMENTS

JP 04320062 A * 11/1992

OTHER PUBLICATIONS

U.S. Appl. No. 60/299,478.*
English Translation of Imamura (JP 04-320062).*

* cited by examiner

*Primary Examiner* — Marcos D. Pizarro

(57) ABSTRACT

The invention relates to an electronic device provided with an electronic component which comprises an integrated circuit arrangement including a semiconducting substrate, active components, and passive components such as capacitors and resistors. The resistors comprise materials of a high resistivity and can be manufactured with resistance values which lie within a narrow tolerance range.

Figure 1:
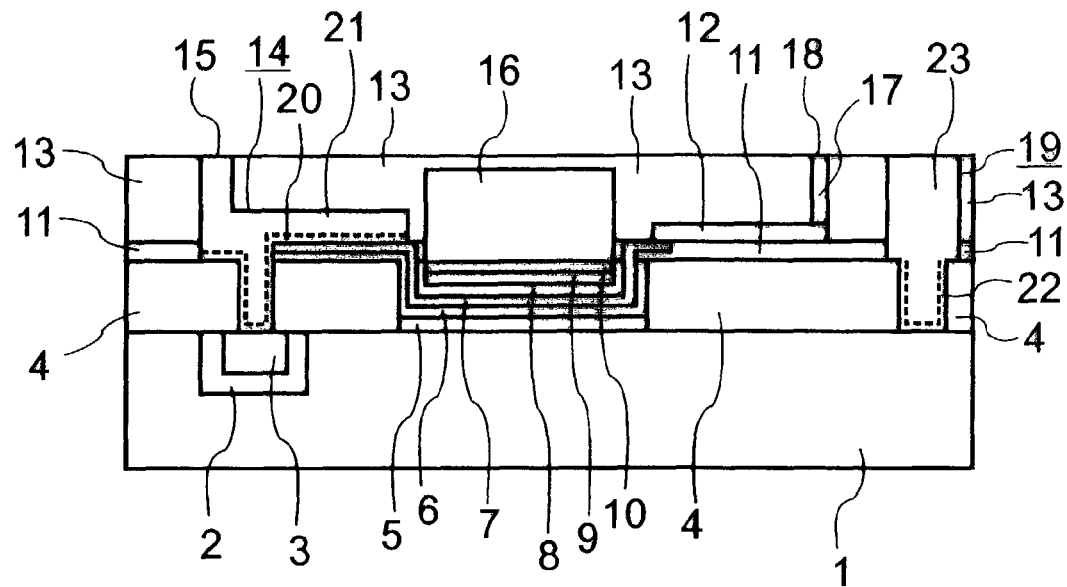

The invention further relates to a transmitter, a receiver, an electronic component, a peripheral circuit, a current supply circuit, a filter module, and an integrated circuit arrangement.

23 Claims, 3 Drawing Sheets

INTEGRATED CIRCUIT DEVICE INCLUDING A RESISTOR HAVING A NARROW-TOLERANCE RESISTANCE VALUE COUPLED TO AN ACTIVE COMPONENT

The invention relates to an electronic device provided with an electronic component which comprises an integrated circuit comprising a semiconducting substrate with at least one active component and, on said semiconducting substrate, at least one capacitor and at least one resistor which are electrically coupled to the active component. The invention further relates to a transmitter, a receiver, a peripheral circuit, a current supply circuit, a filter module, an electronic component, and an integrated circuit.

Capacitor-resistor networks are used nowadays in numerous appliances for electronic data processing or for mobile communication. These networks are often manufactured on ceramic substrates by means of a thick-film technology. It is a disadvantage of this technology that the capacitance values of the capacitors and/or the resistance values of the resistors can be manufactured only with a wide tolerance range. In addition, no active components such as, for example, diodes can be integrated into these networks.

EP 0 192 989, for example, discloses an integrated circuit comprising a transistor, a capacitor, and a resistor. The two electrodes of the capacitor and the resistor are formed by layers of poly-silicon.

Poly-silicon is widely used as an electrode or resistor material in semiconductor components, because poly-silicon is compatible with standard manufacturing processes for semiconductors. The use of poly-silicon as an electrode or resistor material has the disadvantage that the particle size of the poly-silicon is difficult to control in the manufacture of layers of poly-silicon. A further disadvantage is that the degree of doping is difficult to control in the manufacture of doped poly-silicon layers.

These two effects have the result that the capacitance values of the capacitors and/or the resistance values of the resistors can be set with a wide tolerance range only.

Furthermore, poly-silicon has a low resistivity, so that high resistance values can only be created in the circuits by means of resistance meanders, which occupy much space.

It is accordingly an object of the present invention to provide an electronic device which comprises an electronic component provided with an improved integrated circuit, which comprises a semiconducting substrate, at least one active component, at least one capacitor, and at least one resistor.

This object is achieved by means of an electronic device provided with an electronic component which comprises an integrated circuit having a semiconducting substrate with at least one active component and, provided on said semiconducting substrate, at least one capacitor and at least one resistor which are electrically coupled to the active component, wherein the resistor comprises a material which is chosen from the group comprising: β-tantalum, $Ta_xN_y$ ($0 \leq x \leq 1$, $0 \leq y \leq 1$), $Ta_{1-x-y}Si_xN_y$ ($0 \leq x \leq 1$, $0 \leq y \leq 1$), $Ta_{1-x-y}Al_xN_y$ ($0 \leq x \leq 1$, $0 \leq y \leq 1$), $Ni_xCr_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Ti_xW_y$ ($0 \leq x \leq 1$, $0 \leq y \leq 1$), $Ti_xW_yN_z$ ($0 \leq x \leq 1$, $0 \leq y \leq 1$, $0 \leq z \leq 1$), $Ti_xN_y$ ($0 \leq x \leq 1$, $0 \leq y \leq 1$) and $Cu_xNi_y$ ($0 \leq x \leq 1$, $0 \leq y \leq 1$).

Layers of these materials can be provided with a high degree of uniformity, so that resistors can be manufactured whose resistance values lie within a narrow tolerance range.

A further advantage is that these materials have high resistivity values. Owing to the higher resistance value, the outer dimensions of a resistor can be reduced. Valuable semiconductor material can thus be saved, and the process cost can be kept lower. A further advantage is that these materials have a low TCR value (Temperature Coefficient of Resistance) of 0 to 100 ppm/K. This has the result that the resistance value of a resistor changes only slightly also during operation of the electronic device.

If the capacitor is advantageously constructed as a MOS (metal-oxide semiconductor) capacitor, a capacitor is obtained whose capacitance value lies within a narrower tolerance range compared with that of a capacitor which has two electrodes of a semiconducting material, for example poly-silicon.

The advantageous embodiment of the circuit arrangement renders it possible to widen the application range of the electronic component and thus of the electronic device.

The invention further relates to a transmitter, a receiver, each comprising an electronic component with an integrated circuit, to an electronic component, a peripheral circuit, a current supply circuit, and a filter module, each comprising an integrated circuit, as well as to an integrated circuit itself which comprises a semiconducting substrate having at least one active component and, provided on the semiconducting substrate, at least one capacitor and at least one resistor which are electrically coupled to the active component, wherein the resistor comprises a material which is chosen from the group comprising: β-tantalum, $Ta_xN_y$ ($0 \leq x \leq 1$, $0 \leq y \leq 1$), $Ta_{1-x-y}Si_xN_y$ ($0 \leq x \leq 1$, $0 \leq y \leq 1$), $Ta_{1-x-y}Al_xN_y$ ($0 \leq x \leq 1$, $0 \leq y \leq 1$), $Ni_xCr_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Ti_xW_y$ ($0 \leq x \leq 1$, $0 \leq y \leq 1$), $Ti_xW_yN_z$ ($0 \leq x \leq 1$, $0 \leq y \leq 1$, $0 \leq z \leq 1$), $Ti_xN_y$ ($0 \leq x \leq 1$, $0 \leq y \leq 1$) and $Cu_xNi_y$ ($0 \leq x \leq 1$, $0 \leq y \leq 1$).

Figure 2:
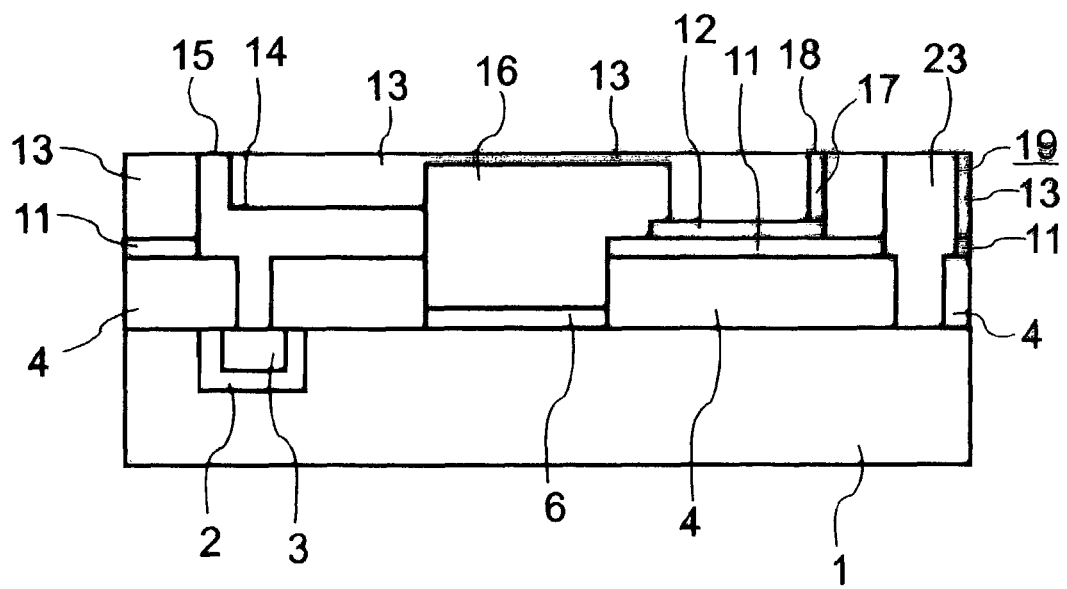
Figure 3:
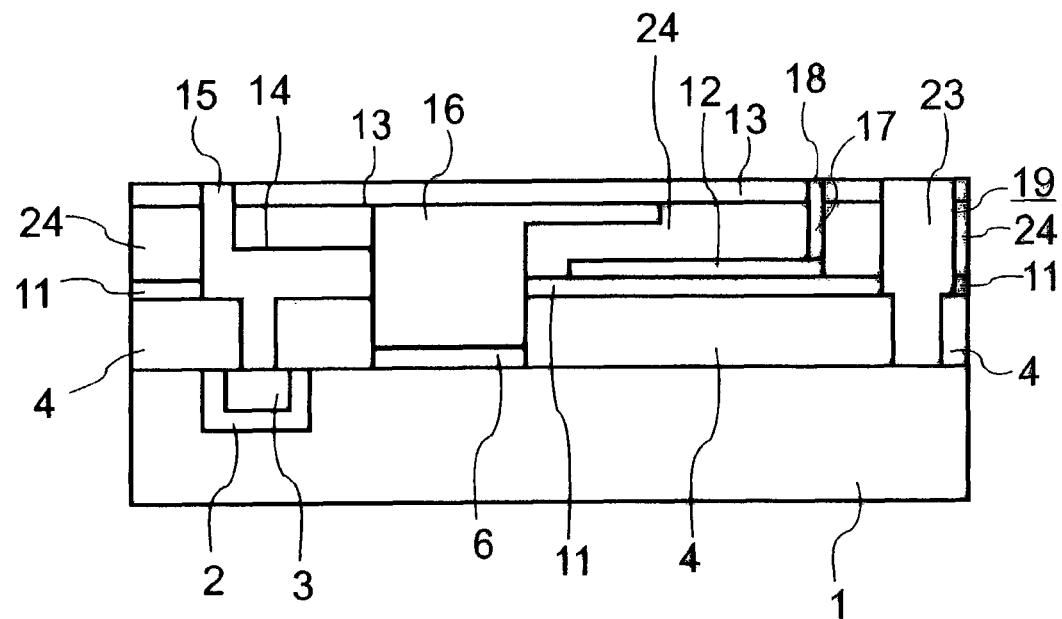
Figure 4:
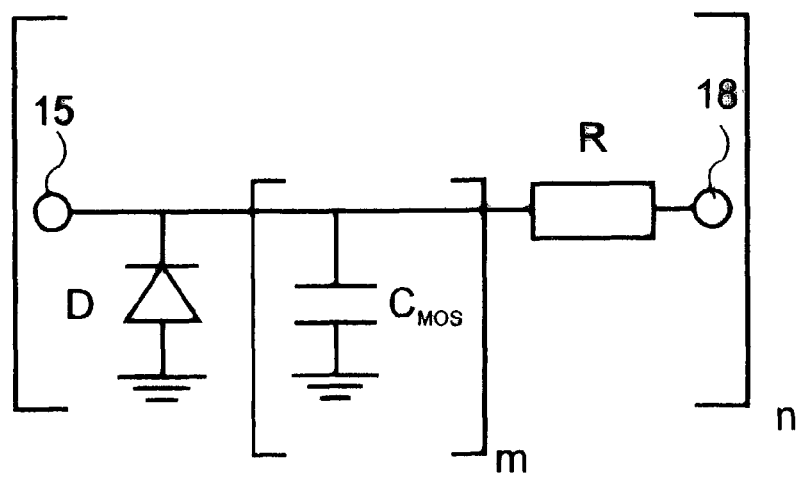
Figure 5:
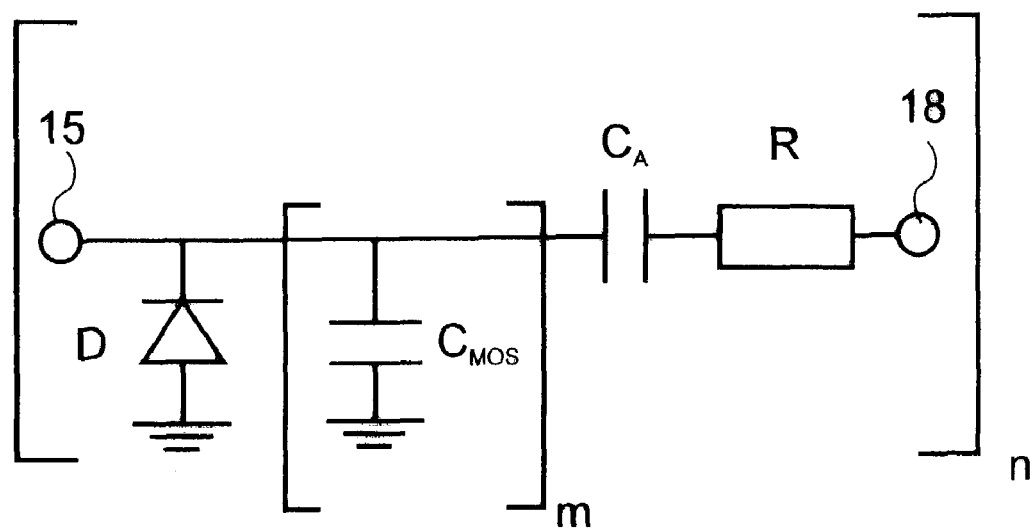

The invention will now be explained in more detail below with reference to five Figures, in which:

FIG. 1 and FIG. 2 each are a diagrammatic cross-sectional view of a semiconducting substrate with a diode, a MOS capacitor, and a resistor, FIG. 3 is a diagrammatic cross-sectional view of a semiconducting substrate with a diode, a MOS capacitor, a resistor, and a further capacitor, and FIG. 4 and FIG. 5 show possible circuit arrangements.

An electronic device may be, for example, a device for electronic data processing such as a computer, a laptop, or a PDA (Personal Digital Assistant). Alternatively, an electronic device may be a mobile data transmission device such as a mobile telephone set.

A mobile telephone device comprises, for example, a power supply unit, a display device, a loudspeaker, a microphone, an input device, a memory device, an antenna, a transmitter, a receiver, peripheral circuits, filter modules, and current supply circuits. The transmitter, the receiver, the peripheral circuits, the filter modules, and the current supply circuits may each comprise an electronic component with an integrated circuit which comprises a semiconducting substrate with at least one active component and, provided on the semiconducting substrate, at least one capacitor and at least one resistor which are electrically coupled to the active component, wherein the resistor comprises a material chosen from the group comprising: β-tantalum, $Ta_xN_y$ ($0 \leq x \leq 1$, $0 \leq y \leq 1$), $Ta_{1-x-y}Si_xN_y$ ($0 \leq x \leq 1$, $0 \leq y \leq 1$), $Ta_{1-x-y}Al_xN_y$ ($0 \leq x \leq 1$, $0 \leq y \leq 1$), $Ni_xCr_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Ti_xW_y$ ($0 \leq x \leq 1$, $0 \leq y \leq 1$), $Ti_xW_yN_z$ ($0 \leq x \leq 1$, $0 \leq y \leq 1$, $0 \leq z \leq 1$), $Ti_xN_y$ ($0 \leq x \leq 1$, $0 \leq y \leq 1$), and $Cu_xNi_y$ ($0 \leq x \leq 1$, $0 \leq y \leq 1$).

The active component may be, for example, a diode or a transistor. Diodes serve, for example, as overvoltage protection devices in a circuit arrangement. A diode may be, for example, a pn diode, a zener diode, a back-to-back diode (diode connected in reverse series), a front-to-back diode (diode connected in series), or a floating diode.

The transistor may be, for example, a bipolar transistor or a field effect transistor (FET), such as, for example, a junction field effect transistor (JFET), a P-channel metal oxide semiconductor field effect transistor (PMOS-FET), an N-channel metal oxide semiconductor field effect transistor (NMOS-FET), or a complementary metal oxide semiconductor field effect transistor (CMOS-FET).

FIG. 1 is a diagrammatic cross-sectional view of a semiconducting substrate 1 with a pn diode, a MOS capacitor, and a resistor. The semiconducting substrate 1 comprises, for example, Si with a dopant of a first doping type having a first doping concentration n1, or a III/V semiconductor such as, for example, GaAs with a dopant of a first doping type having a first doping concentration n1, or a SiC semiconductor with a dopant of a first doping type having a first doping concentration n1, or a SiGe semiconductor with a dopant of a first doping type having a first doping concentration n1. In the semiconducting substrate 1 there is a first semiconductor region 2 which comprises Si with a dopant of a first doping type with a second doping concentration n2, or a III/V semiconductor such as, for example, GaAs, with a dopant of a first doping type having a second doping concentration n2, or an SiC semiconductor with a dopant of a first doping type having a second doping concentration n2. The doping concentration n2 in the first semiconductor region 2 is lower than the doping concentration n1 in the semiconducting substrate 1. A second, smaller semiconductor region 3 comprising Si with a dopant of a second doping type having a third doping concentration n3 or a III/V semiconductor such as, for example, GaAs with a dopant of a second doping type having a third doping concentration n3, or SiC with a dopant of a second type having a third doping concentration n3 is present in the first semiconductor region 2. The dopant of the first doping type used may be, for example, B, Al, or Ga, and the dopant of the second doping type used may be, for example, P, As, or Sb. The first semiconductor region 2 and the second semiconductor region 3 form a pn diode.

An insulating layer 4 is provided on the semiconducting substrate 1, which layer comprises, for example, $SiO_2$, $SiO_2$ doped with a doping oxide such as, for example, boron oxide or phosphorus oxide, or SiN(H). The insulating layer 4 is interrupted in some regions. In these regions, a first oxide layer 5, preferably comprising $SiO_2$, lies on the semiconducting substrate 1. On the oxide layer 5 there is a first dielectric layer 6 which comprises, for example, $Si_3N_4$, $Si_xO_yN_z$ ($0 \leq x \leq 1, 0 \leq y \leq 1, 0 \leq z \leq 1$), $Ta_2O_5$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($0 \leq x \leq 1$), $(Ta_2O_5)_x$—$(SiO_2)_{1-x}$ ($0 \leq x \leq 1$), $TiO_2$, $ZrO_2$, $HfO_2$ or $Nb_2O_5$. A first electrically conducting layer 7 which may comprise, for example, poly-Si, Ta, or Al, lies on the first dielectric layer 6. A second oxide layer 8, preferably comprising $SiO_2$, is provided on the first electrically conducting layer 7. On the second oxide layer 8 there is a second dielectric layer 9 which comprises, for example, $Si_3N_4$, $Si_xO_yN_z$ ($0 \leq x \leq 1, 0 \leq y \leq 1, 0 \leq z \leq 1$), $Ta_2O_5$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($0 \leq x \leq 1$), $(Ta_2O_5)_x$—$(SiO_2)_{1-x}$ ($0 \leq x \leq 1$), $TiO_2$, $ZrO_2$, $HfO_2$ or $Nb_2O_5$.

A first layer 10 with a resistance value is provided on the second dielectric layer 9, which layer 10 comprises, for example, β-tantalum, $Ta_xN_y$ ($0 \leq x \leq 1, 0 \leq y \leq 1$), $Ta_{1-x-y}Si_xN_y$ ($0 \leq x \leq 1, 0 \leq y \leq 1$), $Ta_{1-x-y}Al_xN_y$ ($0 \leq x \leq 1, 0 \leq y \leq 1$), $Ni_xCr_y$ ($0 \leq x \leq 1, 0 \leq y \leq 1$), $Ni_xCr_yAl_z$ ($0 \leq x \leq 1, 0 \leq y \leq 1, 0 \leq z \leq 1$), $Si_xCr_yO_z$ ($0 \leq x \leq 1, 0 \leq y \leq 1, 0 \leq z \leq 1$), $Si_xCr_yN_z$ ($0 \leq x \leq 1, 0 \leq y \leq 1, 0 \leq z \leq 1$), $Ti_xW_y$ ($0 \leq x \leq 1, 0 \leq y \leq 1$), $Ti_xW_yN_z$ ($0 \leq x \leq 1, 0 \leq y \leq 1, 0 \leq z \leq 1$), $Ti_xN_y$ ($0 \leq x \leq 1, 0 \leq y \leq 1$) or $Cu_xNi_y$ ($0 \leq x \leq 1, 0 \leq y \leq 1$).

A third dielectric layer 11 lies on the insulating layer 4, which layer 11 comprises, for example, $Si_3N_4$, $Si_xO_yN_z$ ($0 \leq x \leq 1, 0 \leq y \leq 1, 0 \leq z \leq 1$), $Ta_2O_5$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($0 \leq x \leq 1$), $(Ta_2O_5)_x$—$(SiO_2)_{1-x}$ ($0 \leq x \leq 1$), $TiO_2$, $ZrO_2$, $HfO_2$ or $Nb_2O_5$. On said third dielectric layer 11 we find in some regions a second layer 12 with a resistance value, which layer 12 comprises, for example, β-tantalum, $Ta_xN_y$ ($0 \leq x \leq 1, 0 \leq y \leq 1$), $Ta_{1-x-y}Si_xN_y$ ($0 \leq x \leq 1, 0 \leq y \leq 1$), $Ta_{1-x-y}Al_xN_y$ ($0 \leq x \leq 1, 0 \leq y \leq 1$), $Ni_xCr_y$ ($0 \leq x \leq 1, 0 \leq y \leq 1$), $Ni_xCr_yAl_z$ ($0 \leq x \leq 1, 0 \leq y \leq 1, 0 \leq z \leq 1$), $Si_xCr_yO_z$ ($0 \leq x \leq 1, 0 \leq y \leq 1, 0 \leq z \leq 1$), $Si_xCr_yN_z$ ($0 \leq x \leq 1, 0 \leq y \leq 1, 0 \leq z \leq 1$), $Ti_xW_y$ ($0 \leq x \leq 1, 0 \leq y \leq 1$), $Ti_xW_yN_z$ ($0 \leq x \leq 1, 0 \leq y \leq 1, 0 \leq z \leq 1$), $Ti_xN_y$ ($0 \leq x \leq 1, 0 \leq y \leq 1$) or $Cu_xNi_y$ ($0 \leq x \leq 1, 0 \leq y \leq 1$). Preferably, the second layer 12 with resistance value comprises β-Tantalum, $Ta_xN_y$ ($0 \leq x \leq 1, 0 \leq y \leq 1$), $Ti_xW_yN_z$ ($0 \leq x \leq 1, 0 \leq y \leq 1, 0 \leq z \leq 1$) or $Ti_xN_y$ ($0 \leq x \leq 1, 0 \leq y \leq 1$). A protective layer 13, for example comprising an organic or an inorganic material, or a combination of inorganic materials, or a combination of organic and inorganic materials, is provided over the entire assembly. The organic material used may be, for example, polybenzocyclobutene or polyimide, and the inorganic material used may be, for example, SiN(H), $SiO_2$, or $Si_xO_yN_z$ ($0 \leq x \leq 1, 0 \leq y \leq 1, 0 \leq z \leq 1$).

The second semiconductor region 3 of the pn diode is electrically connected to the input 15 of the circuit arrangement and to the first electrically conducting layer 7 by means of a first current supply lead 14. The first layer 10 with resistance value is connected to ground by means of a second current supply lead. The first electrically conducting layer 7 is structured such that it is in physical and electrical contact with the second layer 12 with resistance value. For this purpose, the first electrically conducting layer 7 and the second layer 12 with resistance value may be structured such that they are arranged partly overlapping or mutually adjoining. The second layer 12 with resistance value is electrically connected to the output 18 of the circuit arrangement by means of a third current supply lead 17. The semiconducting substrate 1 is connected to ground via a fourth current supply lead 19. The current supply leads 14, 16, 17, 19 are formed by contact holes filled up with electrically conducting materials. A current supply lead may comprise one or several electrically conducting materials here, for example in the form of layer sequences. Thus, for example, the first current supply lead 14 may be composed from a material with resistance value provided in the form of a third layer 20 with resistance value and a material 21 of good electrical conductivity such as, for example, Al, Al doped with Cu, or Al doped with Si. The fourth current supply lead 19 may also be built up, for example, from a material with resistance value provided in the form of a fourth layer 22 with resistance value and a material 23 of good electrical conductivity such as, for example, Al, Al doped with Cu, or Al doped with Si.

In this embodiment of the invention, the MOS capacitor is formed by the following layers: semiconducting substrate 1, oxide layer 5, first dielectric layer 6, first electrically conducting layer 7, second oxide layer 8, second dielectric layer 9, and first resistance layer 10. The MOS capacitor in this embodiment has a double stack construction. The semiconducting substrate 1 here serves as the first electrode, the first resistance layer 10 as the second electrode, and the first electrically conducting layer 7 as an intermediate electrode of the MOS capacitor.

Alternatively, the first resistance layer 10 may be left out in this construction, in which case the current supply lead 16 will act as the second electrode of the MOS capacitor.

Depending on the material used for the first electrically conducting layer 7, for example, the second oxide layer 8 may also be left out. The second oxide layer 8 may be left out, for example, if Ta or Al is used as the material for the first electrically conducting layer 7. In addition, the first oxide layer 5 may also be omitted.

Alternatively, the MOS capacitor may have a single stack construction. In this embodiment, the MOS capacitor is formed, for example, by the semiconducting substrate 1, the first oxide layer 5, the first dielectric layer 6, and the first resistance layer 10. Alternatively, the first resistance layer 10 may again be left out also in this embodiment of the MOS capacitor, and the second electrode of the MOS capacitor will then be formed by the second current supply lead 16.

The MOS capacitor may alternatively have a multi-stack construction. Depending on the number of stacks which the MOS capacitor is to have, a corresponding number of oxide layers, dielectric layers, and electrically conducting layers are deposited between the first electrode and the second electrode of the MOS capacitor. Alternatively, the oxide layers may be left out in the multi-stack construction, and a corresponding number of dielectric layers and electrically conducting layers is deposited between the first electrode and the second electrode of the MOS capacitor.

FIG. 2 is a diagrammatic cross-sectional view of a semiconducting substrate 1 with a pn diode, a MOS capacitor, and a resistor, wherein the MOS capacitor has a single stack construction. The second current supply lead 16 is not connected to ground in this embodiment.

A pn diode formed by a first semiconductor region 2 and a second semiconductor region 3 is present in the semiconducting substrate 1. The insulating layer 4 is provided on the semiconducting substrate 1 and is interrupted in a few regions. In these regions, the first dielectric layer 6 lies on the semiconducting substrate 1. The third dielectric layer 11 lies on the insulating layer 4. The second resistance layer 12 lies on the third dielectric layer 11 in a few regions. The protective layer 13 is present on the dielectric layer 11 and on the second resistance layer 12. The second semiconductor region 3 is electrically connected to the input 15 of the circuit arrangement via the first current supply lead 14. The second current supply lead 16 forms the second electrode of the MOS capacitor. In addition, the second current supply lead 16 connects the MOS capacitor to the second resistance layer 12. The MOS capacitor is electrically connected to the second semiconductor region 3 and to the input 15 of the circuit arrangement via the first current supply lead 14 and the second current supply lead 16, which are in electrical contact. The second resistance layer 12 is connected to the output 18 of the circuit arrangement via the third current supply lead 17. The semiconducting substrate 1 is connected to ground by means of the fourth current supply lead 23.

FIG. 3 is a diagrammatic cross-sectional view of a semiconducting substrate 1 with a pn diode, a MOS capacitor, a resistor, and a further capacitor. In this embodiment of a circuit arrangement according to the invention, the second current supply lead 16 is not directly electrically connected to the second resistance layer 12, but instead it is structured such that it serves additionally as the second electrode of the further capacitor. The second resistance layer 12 is structured such that it acts on the one hand as a resistor and on the other hand as the first electrode of the further capacitor. A fourth dielectric layer 24 present between the second resistance layer 12 and those regions of the second current supply lead 16 which serve as the second electrode of the further capacitor forms the dielectric of the further capacitor. The fourth dielectric layer 24 may comprise, for example, $Si_3N_4$, $Si_xO_yN_z$ ($0 \leq x \leq 1, 0 \leq y \leq 1, 0 \leq z \leq 1$), $Ta_2O_5$, $(Ta_2O_5)_x—(Al_2O_3)_{1-x}$ ($0 \leq x \leq 1$), $(Ta_2O_5)_x—(TiO_2)_{1-x}$ ($0 \leq x \leq 1$), $(Ta_2O_5)_x—(Nb_2O_5)_{1-x}$ ($0 \leq x \leq 1$), $(Ta_2O_5)_x—(SiO_2)_{1-x}$ ($0 \leq x \leq 1$), $TiO_2$, $ZrO_2$, or $HfO_2$ or $Nb_2O_5$. A protective layer 13 is provided over the entire assembly. The second current supply lead is not connected to ground in this embodiment.

Alternatively, one or several current supply leads 14, 16, 17, or 19 may be structured such that they can serve as inductance elements, so that the circuit arrangement comprises an inductance as well as a diode, a MOS capacitor, and a resistor. Alternatively, a MEMS ('Micro Electro Mechanical Systems') inductance with a two-dimensional, for example spiraling, or three-dimensional, for example helical structure may be provided on the protective layer 13 and may be integrated with the circuit arrangement by way of the first and/or second current supply lead 14, 16.

A finished electronic component may be provided, for example, with a standard semiconductor housing, a flip chip housing, a plastic housing, a chip scale package, or a ceramic housing. Electrical contacting of the electronic component may be effected by wire bonding or bumps. The bumps may comprise, for example, $NiV/Cu/(Pb_{0.35}Sn_{0.65})$, $NiV/Cu$ $(Pb_{0.4}Sn_{0.6})$, $NiCr/Cu/Ni/Au$, or other materials or material combinations without lead.

FIG. 4 shows a possible circuit arrangement of a network with at least a diode D, a resistor R, and a MOS capacitor $C_{MOS}$. The resistor R is present between an input 15 and an output 18. The diode D lies between the input 15 and ground. The first connection terminal of the MOS capacitor $C_{MOS}$ lies between the input 15 and the resistor R. The second connection terminal of the MOS capacitor $C_{MOS}$ is connected to ground. It is true for n that n=1, 2, 3, 4, . . . ∝. It is true for m, depending on the construction of the MOS capacitor, that m=1, 2, 3, 4, . . . ∝. For a MOS capacitor with a single stack construction, such as the one shown, for example, in FIG. 2, it is true that m=1. For a MOS capacitor with a double stack construction, for example the one shown in FIG. 1, it is true that m=2. For a MOS capacitor with a multi-stack construction, m=3, 4, . . . ∝.

The diode D, the resistor R, and the MOS capacitor $C_{MOS}$ may show different, alternative arrangements.

FIG. 5 shows a possible circuit arrangement of a network with at least a diode D, a resistor R, a MOS capacitor $C_{MOS}$, and a further capacitor $C_A$. The resistor R lies between the input 15 and the output 18. The further capacitor $C_A$ is present between the input 15 and the resistor R. The diode D is connected between the input 15 and ground. The first connection terminal of the capacitor $C_{MOS}$ lies between the input 15 and the further capacitor $C_A$. The second connection terminal of the capacitor $C_{MOS}$ is connected to ground. It is true for n that n=1, 2, 3, 4, . . . ∝. It is true for m, depending on the construction of the MOS capacitor, that m=1, 2, 3, 4, . . . ∝.

The diode D, the resistor R, the MOS capacitor $C_{MOS}$, and the further capacitor $C_A$ may also have different, alternative arrangements.

EMBODIMENT

An electronic component as shown in FIG. 1 with a circuit arrangement as shown in FIG. 4 comprising resistors R arranged between the input 15 and the output 18 of the circuit arrangement, MOS capacitors $C_{MOS}$ arranged between the input 15 and ground, and pn diodes D arranged between the input 15 and ground, comprises a semiconducting substrate 1 of Si with B as the dopant of a first doping type having a first doping concentration n1. The semiconducting substrate 1 has first semiconductor regions 2, which comprise Si with B as the dopant of the first doping type with a second doping concentration n2. The doping concentration n1 is greater than the doping concentration n2. A second, smaller semiconductor region 3 is present in each first semiconductor region 2, comprising Si with P as the dopant of a second doping type with a third doping concentration n3. An insulating layer 4 of $SiO_2$ is provided on the semiconducting substrate 1.

The insulating layer 4 is interrupted in some regions. In these regions, a first oxide layer 5 of $SiO_2$ is present on the semiconducting substrate 1. A first dielectric layer 6 of $Si_3N_4$ lies on the oxide layer 5. A first electrically conducting layer 7 of poly-silicon lies on the first dielectric layer 6, and a second oxide layer 8 of $SiO_2$ is provided on the first electrically conducting layer 7. A second dielectric layer 9 of $Si_3N_4$ is provided on the second oxide layer 8. A first layer 10 having a resistance value and made of β-tantalum is provided on the second dielectric layer 9.

A third dielectric layer 11 of $Si_3N_4$ is present on the insulating layer 4, and a second layer 12 with a resistance value and made of β-tantalum is present on the third dielectric layer 11 in some regions. A protective layer 13 of $Si_3N_4$ is provided over the entire assembly.

The second semiconductor region 3 of the pn diode is electrically connected to the input 15 of the circuit arrangement and to the first electrically conducting layer 7 by means of a first current supply lead 14. The first current supply lead 14 is composed of a layer sequence of a third resistance layer 20 of β-tantalum and a layer of Si-doped Al as a well-conducting material 21. The first layer 10 with a resistance value is connected to ground via a second current supply lead 16. The first electrically conducting layer 7 is structured such that it partly overlaps the second layer 12 with a resistance value. The second layer 12 with a resistance value is electrically connected to the output 18 of the circuit arrangement by means of a third current supply lead 17 of Al doped with Si. The semiconducting substrate 1 is connected to ground by means of a fourth current supply lead 19 which is composed of a fourth layer 22 having a resistance value and made of β-tantalum and Al doped with Si as an electrically well conducting material 23.

Such a circuit arrangement was used as a low-pass filter in a mobile telephone appliance.

The invention claimed is:

1. An electronic component which comprises an integrated circuit comprising a semiconducting substrate with at least one active component and, on said semiconducting substrate, at least one capacitor and at least one resistor which are electrically coupled to the active component, wherein the resistor does not comprise poly-silicon and wherein the resistor comprises at least one of: $Ta_{1-x-y}Si_xN_y$ ($0<x<1, 0<y<1$), $Ni_xCr_y$ ($0<x<1, 0<y<1$), $Si_xCr_yO_z$ ($0<x<1, 0<y<1, 0<z<1$), $Si_xCr_yN_z$ ($0<x<1, 0<y<1, 0<z<1$), or $Cu_xNi_y$ ($0<x<1, 0<y<1$).

2. An integrated circuit comprising a semiconducting substrate with at least one active component and, on said semiconducting substrate one capacitor and at least one resistor which are electrically coupled to the active component, wherein the resistor does not comprise poly-silicon and wherein the resistor comprises at least one of: $Ta_{1-x-y}Si_xN_y$ ($0<x<1, 0<y<1$), $Ni_xCr_y$ ($0<x<1, 0<y<1$), $Si_xCr_yO_z$ ($0<x<1, 0<y<1, 0<z<1$), $Si_xCr_yN_z$ ($0<x<1, 0<y<1, 0<z<1$), or $Cu_xNi_y$ ($0<x<1, 0<y<1$).

3. An electronic device provided with an electronic component which comprises an integrated circuit comprising a semiconducting substrate with at least one active component and, on said semiconducting substrate at least one capacitor and at least one resistor which are electrically coupled to the active component, wherein the resistor does not comprise poly-silicon and wherein the resistor comprises at least one of: $Ta_{1-x-y}Si_xN_y$ ($0<x<1, 0<y<1$), $Ni_xCr_y$ ($0<x<1, 0<y<1$), $Si_xCr_yO_z$ ($0<x<1, 0<y<1, 0<z<1$), $Si_xCr_yN_z$ ($0<x<1, 0<y<1, 0<z<1$), or $Cu_xNi_y$ ($0<x<1, 0<y<1$).

4. An electronic device as claimed in claim 3, characterized in that the capacitor is a MOS (Metal Oxide Semiconductor) capacitor.

5. An electronic device as claimed in claim 3, wherein the electronic device includes a receiver, and the resistor has a resistive value within a tolerance range that is less than a range of 100 ohms and 1 megaohms.

6. An electronic device as claimed in claim 3, wherein the electronic device includes a transmitter provided with the electronic component, and at least one of the resistor and the capacitor includes a conductive material having a value within a tolerance range that is less than a range of 100 ohms and 1 megaohms.

7. An electronic, device claimed in claim 3, wherein the electronic device includes a peripheral circuit which comprises the integrated circuit, and at least one of the resistor and the capacitor includes a conductive material having a value within a tolerance range that is less than a range of 100 ohms and 1 megaohms.

8. An electronic device as claimed in claim 3, wherein the electronic device includes a current supply circuit which comprises the integrated circuit, and at least one of the resistor and the capacitor includes a conductive material having a value within a tolerance range that is less than a range of 100 ohms and 1 megaohms 9. An electronic device as claimed in claim 3, wherein the electronic device includes a filter module which comprises the integrated circuit, and at least one of the resistor and the capacitor includes a conductive material having a value within a tolerance range that is less than a range of 100 ohms and 1 megaohms.

10. An electronic device as claimed in claim 3, wherein the capacitor has a narrow tolerance range that is less than the range of a capacitor having conductive layers of a sheet resistance value of between 100 ohms per square and 1 megaohms per square.

11. An electronic device as claimed in claim 3, wherein the capacitor has a resistance layer that includes at least one of: $Ta_{1-x-y}Si_xN_y$ ($0<x<1, 0<y<1$), $Ni_xCr_y$ ($0<x<1, 0<y<1$), $Si_xCr_yO_z$ ($0<x<1, 0<y<1, 0<z<1$), $Si_xCr_yN_z$ ($0<x<1, 0<y<1, 0<z<1$), or $Cu_xNi_y$ ($0<x<1, 0<y<1$).

12. An electronic device as claimed in claim 3, further comprising a current supply lead coupled between an input and the active component, the current supply lead having a layered construction including a resistance layer that includes at least one of: $Ta_{1-x-y}Si_xN_y$ ($0<x<1, 0<y<1$), $Ni_xCr_y$ ($0<x<1, 0<y<1$), $Si_xCr_yO_z$ ($0<x<1, 0<y<1, 0<z<1$), $Si_xCr_yN_z$ ($0<x<1, 0<y<1, 0<z<1$), or $Cu_xNi_y$ ($0<x<1, 0<y<1$).

13. An electronic device as claimed in claim 3, wherein the active component is a diode or a transistor, and at least one of the resistor and the capacitor includes a conductive material having a value within a tolerance range that is less than a range of 100 ohms and 1 megaohms.

14. An electronic device as claimed in claim 3, wherein the resistor excludes $Ta_{1-x-y}Si_xN_y$.

15. An electronic device as claimed in claim 3, wherein the resistor excludes $Ni_xCr_y$.

16. An electronic device as claimed in claim 3, wherein the resistor excludes $Si_xCr_yO_z$.

17. An electronic device as claimed in claim 3, wherein the resistor excludes $Si_xCr_yN_z$.

18. An electronic device as claimed in claim 3, wherein the resistor excludes $Cu_xNi_y$.

19. An electronic device as claimed in claim 3, wherein the resistor has a tolerance range that is narrower than that of a capacitor having two electrodes made of a poly-silicon semiconducting material respectively having a sheet resistance value of between 100 ohms per square and 1 megaohms per square.

20. An electronic device as claimed in claim 3, wherein the resistor includes one or more layers of $Ta_{1-x-y}Si_xN_y$ ($0<x<1$, $0<y<1$), $Ni_xCr_y$ ($0<x<1, 0<y<1$), $Si_xCr_yO_z$ ($0<x<1, 0<y<1$, $0<z<1$), $Si_xCr_yN_z$, ($0<x<1, 0<y<1, 0<z<1$, or $Cu_xNi_y$ ($0<x<1$, $0<y<1$), said layers being provided with a high degree of uniformity sufficient to produce a narrow tolerance range that is narrower than a resistance value range of between 100 ohms and 1 megaohms.

21. An electronic device as claimed in claim 3, wherein the resistor has a temperature coefficient of resistance of 0 to 100 ppm/K and has a resistive value within a tolerance range that is less than a range of 100 ohms and 1 megaohms.

22. An electronic device as claimed in claim 3, characterized in that the circuit arrangement comprises at least one further passive component, and the resistor has a tolerance range that is less than a range of between 100 ohms and 1 megaohms

23. An electronic device as claimed in claim 22, wherein the at least one further passive component includes one or more of resistors, capacitors, or inductors.

* * * * *